United States Patent [19]
Chae

[11] Patent Number: 5,442,215
[45] Date of Patent: Aug. 15, 1995

[54] THIN FILM TRANSISTOR HAVING AN ASYMMETRICAL LIGHTLY DOPED DRAIN STRUCTURE

[75] Inventor: Gee S. Chae, Seoul Incheon, Rep. of Korea

[73] Assignee: Goldstar Co., Ltd., Seoul, Rep. of Korea

[21] Appl. No.: 220,665

[22] Filed: Mar. 31, 1994

[30] Foreign Application Priority Data

Mar. 31, 1993 [KR] Rep. of Korea .................. 93-5434

[51] Int. Cl.⁶ .................. H01L 27/01; H01L 27/13; H01L 29/78
[52] U.S. Cl. .................. 257/352; 257/344; 257/382; 257/408
[58] Field of Search .............. 257/347, 348, 352, 353, 257/344, 408, 57, 66, 382

[56] References Cited

U.S. PATENT DOCUMENTS

| 4,050,965 | 9/1977 | Ipri et al. | 257/352 |
| 4,743,837 | 5/1988 | Herzog | 324/60 CD |
| 4,899,202 | 2/1990 | Blake et al. | 257/348 |
| 4,969,023 | 11/1990 | Svedberg | 257/347 |

FOREIGN PATENT DOCUMENTS

| 58-127379 | 7/1983 | Japan | 257/347 |
| 63-204769 | 8/1988 | Japan | . |
| 2-239669 | 9/1990 | Japan | 257/347 |
| 4-241452 | 8/1992 | Japan | 257/347 |
| 4-306843 | 10/1992 | Japan | . |

*Primary Examiner*—Ngân V. Ngô
*Attorney, Agent, or Firm*—Jacobson, Price, Holman & Stern

[57] ABSTRACT

A thin film transistor having an asymmetrical LDD structure which can remove a kink phenomenon (i.e., unstable operation characteristic) of the TFT. According to the TFT, a dual LDD junction structure is formed in the drain region by dual doping, while no junction is formed in the source region so as to remove the energy difference existing at the junction in the source region. On the source electrode, silicide may be formed in order to minimize the contact resistance between the electrode and the metallic terminal thereof.

4 Claims, 3 Drawing Sheets

FIG. 3 (PRIOR ART)
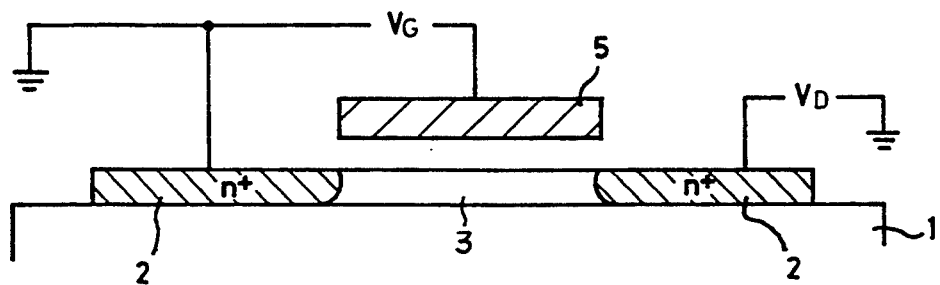
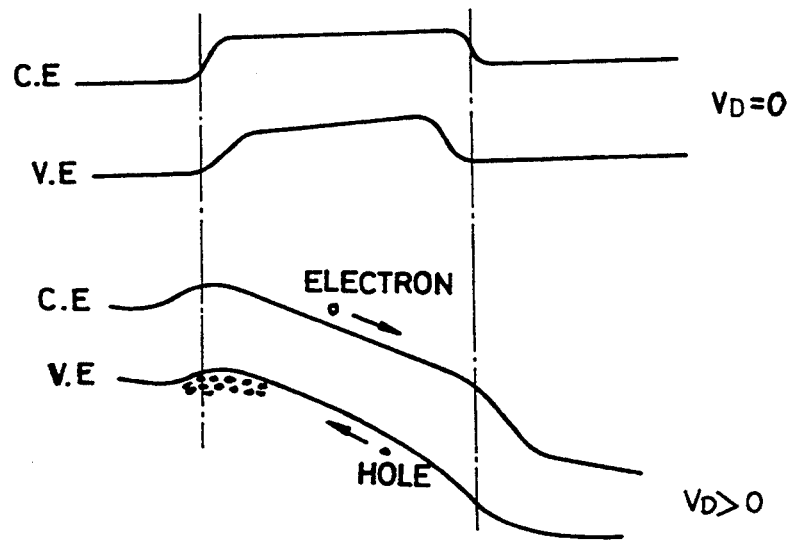
FIG. 4A
FIG. 4B
FIG. 5
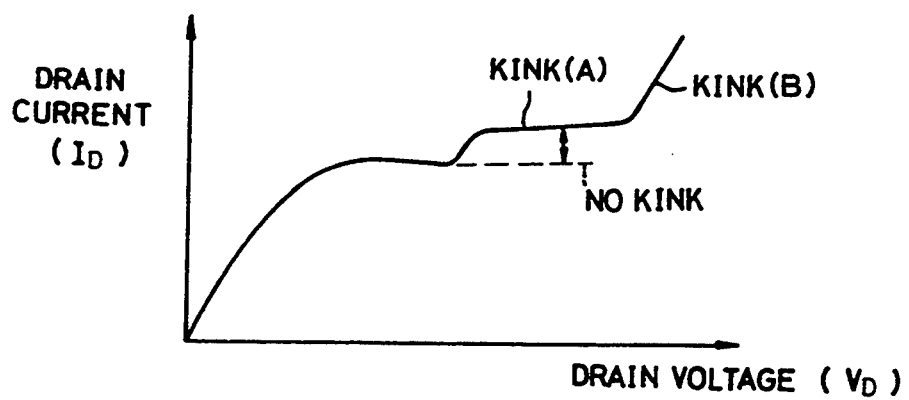

THIN FILM TRANSISTOR HAVING AN ASYMMETRICAL LIGHTLY DOPED DRAIN STRUCTURE

BACKGROUND OF THE INVENTION

1. Field of the Invention

The present invention relates to a thin film transistor (TFT), and more particularly to a TFT having an asymmetrical lightly doped drain(LDD) structure, which can reduce a kink phenomenon which is an unstable operation characteristic of the TFT.

2. Description of the Prior Art

FIG. 1A shows a construction of a conventional top-gate coplanar self-aligned TFT having a non-LDD structure. In the TFT of FIG. 1A, source and drain regions 2 are formed on a transparent insulating substrate 1 by doping high-density impurities (n+). An active layer 3 is formed between the source and drain regions 2. On the upper surface of the active layer 3, a gate-insulating layer 4 is formed, and then a gate electrode 5 is formed on the gate-insulating layer 4.

FIG. 1B shows a construction of a conventional TFT having an LDD structure. In the LDD type TFT of FIG. 1B, source and drain regions 2 are formed on the substrate 1 by doping high-density impurities(n+), and LDD regions 6 are also formed on the substrate 1 by doping low-density impurities (n−).

An active layer 3 is formed between the LDD regions 6. On the upper surface of the active layer 3 is formed a gate-insulating layer 4, and then a gate electrode 5 is formed on the gate-insulating layer 4. FIG. 2 shows an equivalent circuit of the TFTs as shown in FIGS. 1A and 1B.

Meanwhile, according to the TFTs having the non-LDD structure and the LDD structure of FIG. 1A and FIG. 1B, a process of injecting ions of n+ or P+ type is performed in order to form source and drain regions 2. By such ion injection, junctions are formed between the source and drain regions 2 and the active layer 3, respectively.

FIG. 3 is a schematic diagram of the TFT having the non-LDD structure of FIG. 1A, showing the state that the gate and drain voltages $V_G$ and $V_D$ are applied to the corresponding electrodes. Referring to FIG. 3, junctions are formed between the source and drain regions 2 and the active layer 3, and thereby, as shown in FIG. 4A, a step energy band is formed at the junctions due to the difference of charge density between the source and drain regions 2 and the active layer 3.

In this case, if a drain voltage $V_D$ larger than 0V (i.e., $V_D>0$) is applied to the drain region, the step energy band is inclined along the traveling path of the carriers in the doped semiconductor, which may be electrons or holes, in accordance with the applied voltage as shown in FIG. 4B. The inclination of the energy band as described above corresponds to an electric field, and thus the carriers are transferred in their own directions according to the electric field, which forms the electric current of the TFT.

That is, if a voltage $V_D$ larger than 0V (i.e., $V_D>0$) is applied to the drain region, holes are transferred from the drain region to the source region. In this case, the holes are accumulated at the junction in the source region until the drain voltage reaches a predetermined level, because the transfer of the holes are obstructed due to the energy level difference formed at the junction. The holes accumulated at the junction as described above have effect on the electric field at the junction. Thereafter, if the drain voltage $V_D$ goes on increasing to reach the predetermined level surpassing the energy difference at the junction, an abrupt flow of drain current, which is defined as a kink phenomenon, occurs as shown in FIG. 5.

The kink phenomenon as described above makes the operation characteristic of the TFT unstable. Though a method of making the thickness of the active layer thinner is adopted presently to prevent occurrence of the kink phenomenon, there are difficulties in the working process thereof such as etching.

SUMMARY OF THE INVENTION

The present invention has been made to overcome the problems involved in the prior art. It is an object of the present invention to provide a TFT having an asymmetrical LDD structure, which can reduce a kink phenomenon by eliminating the energy difference at the junction in the source region of the TFT.

To achieve the above object, there is provided a TFT having an asymmetrical LDD structure, which comprises:

an insulating substrate;

an active layer formed on said substrate;

a source electrode formed on said active layer;

a drain electrode formed on said substrate by doping high-density impurities;

an LDD region formed on said substrate by doping low-density impurities, said LDD region being in contact with said drain electrode;

a gate-insulating layer formed on the upper surface of said active layer placed between said source electrode and said LDD region; and a gate electrode formed on said gate-insulating layer.

Preferably, silicide may be formed on the upper surface of said source electrode in order to minimize the contact resistance between said source electrode and the metallic terminal thereof.

BRIEF DESCRIPTION OF THE DRAWINGS

The above object and other features of the present invention will become more apparent by describing the preferred embodiment thereof with reference to the accompanying drawings, in which:

FIG. 3 is a schematic explanatory view explaining the characteristic of the non-LDD type TFT of FIG. 1A.

FIGS. 4A and 4B show energy band states of semiconductor layers in the TFT of FIG. 3, in cases of $V_D=0$ and $V_D>0$, respectively.

FIG. 5 is a graph showing the drain current characteristic of the TFT of FIG. 3, including kink phenomena.

DETAILED DESCRIPTION OF THE PREFERRED EMBODIMENT

Figure 1A:
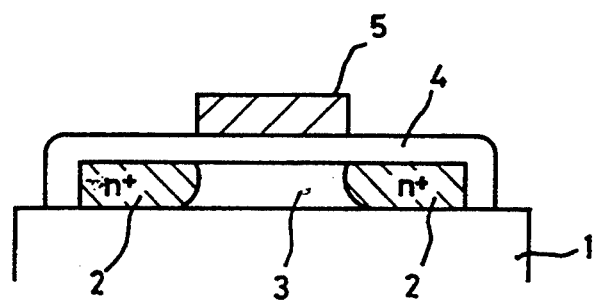
FIG. 1A is a vertical sectional view of a conventional non-LDD type TFT.
Figure 1B:
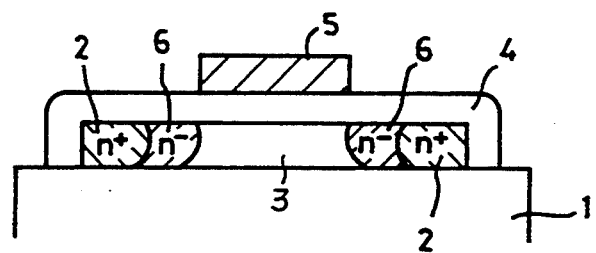
FIG. 1B is a vertical sectional view of a conventional LDD type TFT.
Figure 2:
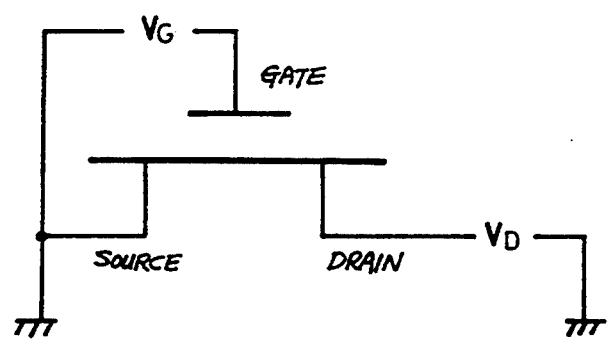
FIG. 2 is an equivalent circuit diagram of the TFT shown in FIGS. 1A and 1B.
Figure 6:
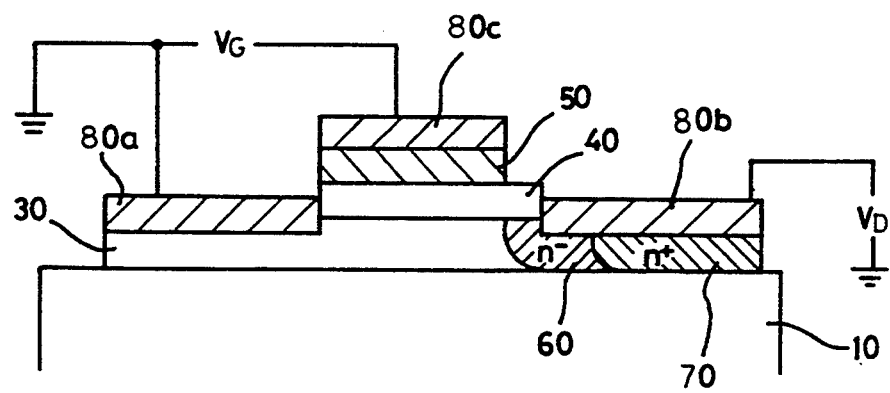
FIG. 6 is a vertical sectional view of a TFT having an asymmetrical LDD structure according to the present invention.

FIG. 6 shows the TFT having an asymmetrical LDD structure according to the present invention. According to the present TFT of FIG. 6, an active layer 30 is formed on a transparent insulating substrate 10 and a source electrode is formed on the active layer 30.

A dual junction region, which is composed of an LDD region 60 as a lowly doped layer and a drain electrode 70 as a highly doped layer, is formed on the opposite side of the source electrode. A gate-insulating layer 40 is formed on the active layer 30 and a gate electrode 50 is formed on the gate-insulating layer 40. In order to effect a good electric contact to metallic terminals, silicide layers 80a, 80b and 80c are formed on the source, gate and drain electrodes 30, 50 and 70, respectively.

In detail, the lowly doped layer (i.e., LDD region (60)) is formed on the active layer 30 by an ion injection method, that is, by injecting thereon low-density impurities ($n^-$) after the active layer 30 is deposited on the substrate 10 and then is patterned. Thereafter, the drain electrode 70 is formed by the same ion injection method, that is, by injecting high-density impurities ($n^+$) into the LDD region 60, so that the LDD structure is formed only on the drain region.

At this time, the injected impurities may be of n or p type, causing the TFT to be of p-type or n-type channel.

After the LDD structure is formed only in the drain region, the gate-insulating layer 40 is deposited on the active layer 30 which is placed between the source and drain electrodes 30 and 70, and is then patterned. On the patterned gate-insulating layer 40, the gate electrode 50 is formed. Silicide layers 80a, 80b and 80c are formed on the upper surfaces of the source, gate and drain electrodes 30, 50 and 70, respectively, in order to minimize the contact resistance between the electrodes and the metallic terminals thereof.

The features and operations of the TFT having an asymmetrical LDD structure according to the present invention as constructed above will now be explained in detail.

Semiconductor devices of CMDS, NMOS or PMOS type have the characteristics in that the current flows in a predetermined direction except the leakage current and thus the hole current always flows to the source electrode 30.

Figure 7:
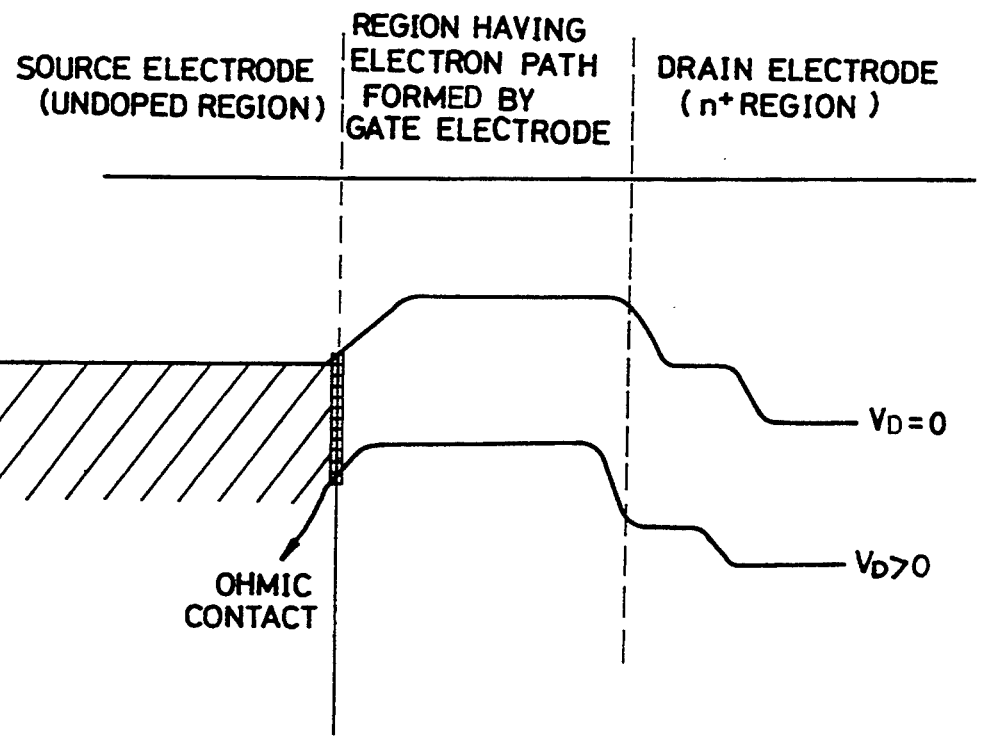
FIG. 7 shows energy band states of semiconduct layers in the TFT of FIG. 6.

According to the present TFT, no junction is formed on the source region and, as shown in FIG. 7, no energy difference exists on the electron path near the source electrode 30. Accordingly, the accumulation of holes as shown in FIG. 4B does not occur even when the drain voltage $V_D$ increases (i.e., $V_D>0$), resulting in that the kink phenomenon (kink A), being an abrupt increase of current flow, also does not occur as shown in FIG. 5. Also, the kink phenomenon (kink B) occurring at the junction in the drain region can be reduced since a dual LDD junction structure is provided in the drain region.

From the foregoing, it will be apparent that the present invention provides the advantages in that the energy difference existing on the electron path near the source electrode can be removed by forming a dual LDD junction structure only in the drain region by ion injection, thereby preventing kink phenomena of the TFT and thus stabilizing the operation characteristics of the TFT.

While the present invention has been described and illustrated herein with reference to the preferred embodiment thereof, it will be understood by those skilled in the art that various changes in form and details may be made therein without departing from the spirit and scope of the invention.

What is claimed is:

1. A thin film transistor having an asymmetrical lightly doped drain structure, comprising:
    an insulating substrate;
    an active layer formed on said substrate;
    a source electrode formed on one side of said active layer as an integral part of said active layer;
    a drain electrode formed on said substrate by doping high-density impurities;
    a lightly doped drain region formed on said substrate by doping low-density impurities, said lightly doped drain region being in contact with said drain electrode;
    a gate-insulating layer formed on an upper surface of said active layer between said source electrode and said lightly doped drain region; and
    a gate electrode formed on said gate-insulating layer.

2. A thin film transistor as claimed in claim 1, wherein silicide is formed on said source electrode, said drain electrode and/or said gate electrode in order to minimize the contact resistance between said electrodes and metallic terminals therefor.

3. A thin film transistor as claimed in claim 1, wherein said doping high-density and low-density impurities are of n type or p type, respectively, so that said thin film transistor is of n-type channel.

4. A thin film transistor as claimed in claim 1, wherein said doping high-density and low-density impurities are of p type and n type, respectively, so that said thin film transistor is of p-type channel.

* * * * *